(12) United States Patent
Park

(10) Patent No.: US 7,776,761 B2
(45) Date of Patent: Aug. 17, 2010

(54) METHOD OF FABRICATING SEMICONDUCTOR DEVICE HAVING MULTIPLE GATE INSULATING LAYER

(75) Inventor: Chan-Sik Park, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 479 days.

(21) Appl. No.: 11/476,505

(22) Filed: Jun. 28, 2006

(65) Prior Publication Data

US 2007/0122981 A1    May 31, 2007

(30) Foreign Application Priority Data

Nov. 28, 2005  (KR) .................... 10-2005-0114420

(51) Int. Cl.
*H01L 21/31* (2006.01)
*H01L 21/469* (2006.01)

(52) U.S. Cl. ............... 438/775; 438/275; 438/769; 438/770; 438/778; 438/787; 438/981; 257/391; 257/392; 257/E21.625

(58) Field of Classification Search .......... 438/275, 438/286, 770, 775, 769; 257/E21.625, 391, 257/392

See application file for complete search history.

(56) References Cited

U.S. PATENT DOCUMENTS 5,926,741 A * 7/1999 Matsuoka et al. ........... 438/778
6,080,682 A * 6/2000 Ibok ........................... 438/770
6,110,842 A * 8/2000 Okuno et al. ............... 438/776
6,124,171 A * 9/2000 Arghavani et al. .......... 438/286
7,563,726 B2 * 7/2009 Cho et al. ................... 438/769

FOREIGN PATENT DOCUMENTS

| JP | 090982729   | 4/1997  |
| KR | 20020034326 | 5/2002  |
| KR | 20030093713 | 12/2003 |
| KR | 20050011218 | 1/2005  |

OTHER PUBLICATIONS

English Abstract for Publication No.: 1020020034326.
English Abstract for Publication No.: 1020030093713.
English Abstract for Publication No.: 1020050011218.
English Abstract for Publication No.: 09-092729.

* cited by examiner

*Primary Examiner*—Matthew C Landau
*Assistant Examiner*—Vicki B Booker
(74) *Attorney, Agent, or Firm*—F. Chau & Associates, LLC

(57) ABSTRACT

A method of fabricating a semiconductor device is provided. The method includes preparing a semiconductor substrate having first and second regions, forming a mask layer pattern on the second region, growing an oxidation retarding layer on the first region and removing the mask layer pattern. The method further includes growing a silicon oxide layer on the semiconductor substrate to form gate insulating layers having different thicknesses from one another on the first and second regions.

11 Claims, 6 Drawing Sheets

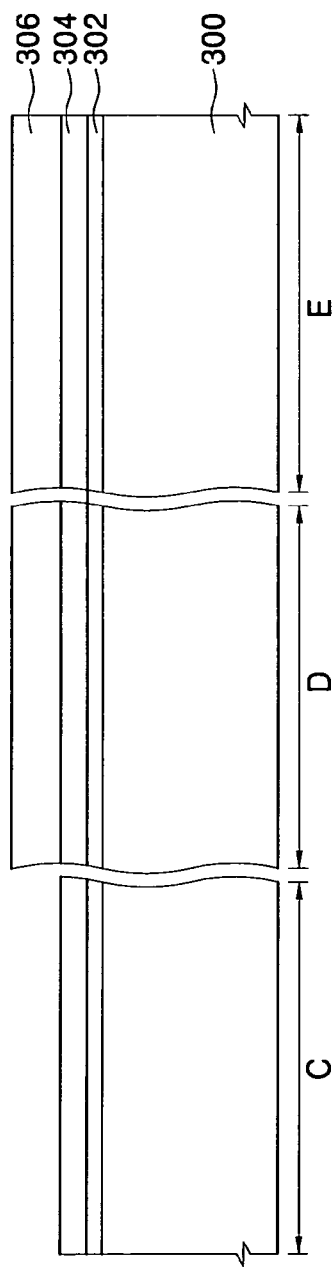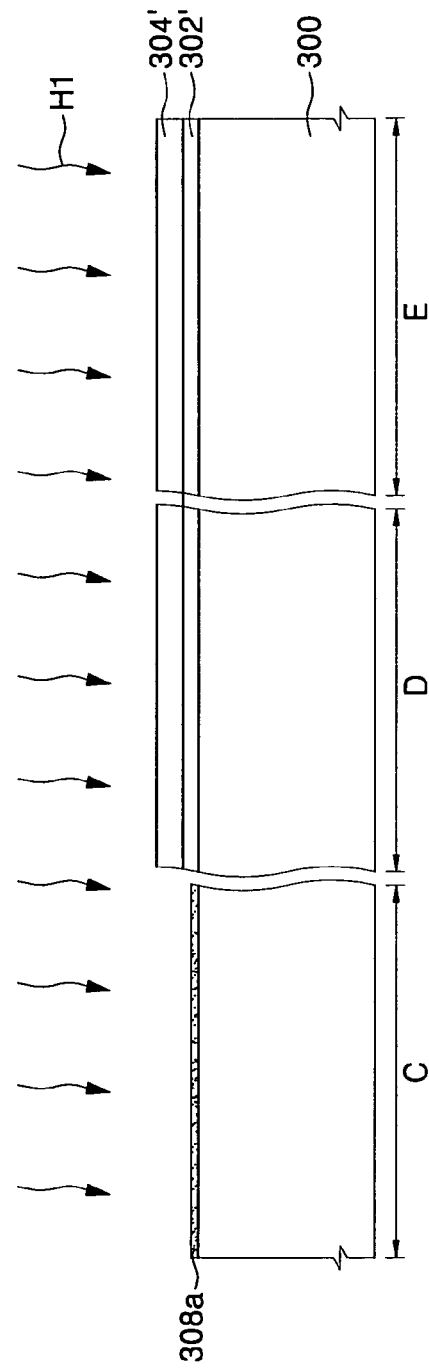

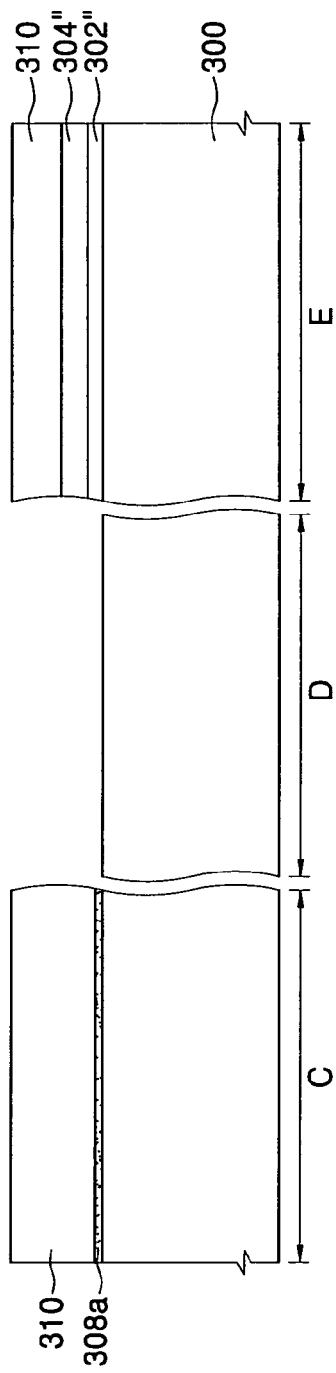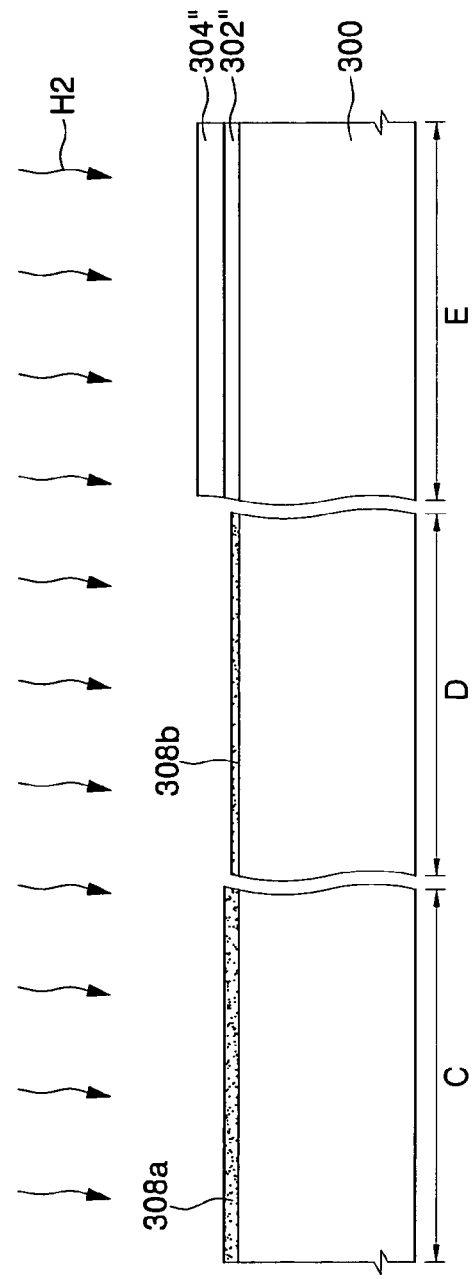

METHOD OF FABRICATING SEMICONDUCTOR DEVICE HAVING MULTIPLE GATE INSULATING LAYER

CROSS-REFERENCE TO RELATED APPLICATION

This application claims priority to and the benefit of Korean Patent Application No. 2005-0114420, filed Nov. 28, 2005, the disclosure of which is hereby incorporated by reference herein in its entirety.

BACKGROUND OF THE INVENTION

1. Technical Field of the Invention

The present disclosure relates to a method of fabricating a semiconductor device, and more particularly, to a method of fabricating a semiconductor device having a multiple gate insulating layer.

2. Description of the Related Art

Certain products in the semiconductor industry require semiconductor devices having various properties. To accommodate these types of products, system-on-chip (SOC) technology which merges a memory and a logic circuit into one chip has been developed. For example, an MDL (merged DRAM and Logic) device in which a dynamic random access memory (DRAM) region and a logic region are merged, and an MFL (merged Flash and Logic) device in which a flash memory region and a logic region are merged, have each been developed given as typical example.

To fabricate devices having various properties, such as, different operating voltages in a single chip, gate insulating layers should be formed having various thicknesses. For example, with a MDL device, a high voltage is applied to a gate insulating layer in the DRAM region, so that the gate insulating layer should be formed relatively thick in this region, whereas, in the logic region which may require a fast operating speed, the gate insulating layer in this region should be formed relatively thin. Moreover, even with a chip composed of the same devices, the devices of this chip should still have gate insulating layers with various thicknesses so that different operating voltages may be applied thereto. For example, a negative channel metal oxide semiconductor (NMOS) region should have a thicker gate insulating layer than a positive channel metal oxide semiconductor (PMOS) region, and a peripheral region should have a thicker gate insulating layer than a cell region.

Consequently, techniques of forming dual or multiple gate insulating layers having different thicknesses on a semiconductor substrate have been developed.

For example, a method of forming a dual gate insulating layer is described in U.S. Pat. No. 6,124,171, entitled "Method of Forming Gate Oxide Layer Having Dual Thickness by Oxidation Process." According to U.S. Pat. No. 6,124,171, after growing a first gate oxide layer on a semiconductor substrate, a silicon nitride layer pattern is formed on the first gate oxide layer. The first gate oxide layer is etched using the silicon nitride layer pattern as an etching mask. Subsequently, a second gate oxide layer that is thinner than the first gate oxide layer is grown on the exposed surface of the semiconductor substrate.

However, the above-mentioned conventional method may have difficulties with respect to forming gate insulating layers having different thicknesses in, for example, three or more different regions, because in this conventional method a second gate oxide layer is grown by performing an oxidation process again after etching and removing the first gate oxide layer. Furthermore, another difficulty with the above conventional method may be that by forming a thin gate oxide layer in a PMOS region, boron implanted in a polysilicon gate may penetrate into a channel region through a gate oxide layer and cause polysilicon gate depletion and threshold voltage fluctuation.

Thus, there is a need for a method of fabricating a semiconductor device having gate insulating layers with different thicknesses formed on a semiconductor substrate using a single oxidation process. In addition, there is a need for a method of fabricating a semiconductor device which can minimize polysilicon gate depletion and threshold voltage fluctuation caused by impurities penetrating from a gate electrode to a channel region.

SUMMARY OF THE INVENTION

In accordance with an exemplary embodiment of the present invention, a method of fabricating a semiconductor device is provided. The method includes preparing a semiconductor substrate having first and second regions, forming a mask layer pattern on the second region, growing an oxidation retarding layer on the first region, and removing the mask layer pattern. The method further includes growing a silicon oxide layer on the semiconductor substrate to form gate insulating layers having different thicknesses from one another on the first and second regions.

The silicon oxide layer may be grown to have a first thickness on the first region and a second thickness that is thicker that the first thickness on the second region.

The oxidation retarding layer may be formed of a silicon oxynitride layer. The gate insulating layers may be formed of a stack of a silicon oxide layer and a silicon oxynitride layer on the first region and of a silicon oxide layer on the second region, and the oxidation retarding layer may be thicker on the second region than on the first region.

The oxidation retarding layer may be grown by nitridation-treating the semiconductor substrate having the mask layer pattern. Nitridation-treating the semiconductor substrate may comprise annealing the semiconductor substrate in a gas atmosphere containing nitrogen.

After forming the gate insulating layers, gate electrodes may be formed on the first and second regions.

The first region may be a low voltage region, a PMOS region, a cell region, or a logic region of an MDL device, and the second region may be a high voltage region, an NMOS region, a peripheral region, or a DRAM region of an MDL device.

In accordance with an exemplary embodiment of the present invention, a method of fabricating a semiconductor device is provided. The method includes preparing a semiconductor substrate having first, second and third regions, forming a mask layer pattern on the second and third regions, growing a first oxidation retarding layer on the first region, patterning the mask layer pattern to form a residual mask layer pattern which remains on the third region and growing a second oxidation retarding layer on the second region, and further growing the first oxidation retarding layer. The method further includes removing the residual mask layer pattern, growing a silicon oxide layer on the semiconductor substrate having the first and second oxidation retarding layers to thereby form gate insulating layers having different thicknesses on the first, second and third regions.

The silicon oxide layer may be grown to have a first thickness on the first region, to have a second thickness that is thicker than the first thickness on the second region, and to have a third thickness that is thicker than the second thickness on the third region.

The first and second oxidation retarding layers may be formed of silicon oxynitride layers. The gate insulating layers may be formed of a stack of a silicon oxide layer and a silicon oxynitride layer on the first and second regions and of a silicon oxide layer on the third region, and the gate insulating layers may be formed thicker on the second region than on the first region and thicker on the third region than on the second region.

The first oxidation retarding layer may be grown by first nitridation-treating the semiconductor substrate having the mask layer pattern. The first nitridation-treating the semiconductor substrate may comprise annealing the substrate in a gas atmosphere containing nitrogen. The second oxidation retarding layer may be grown by second nitridation-treating the semiconductor substrate having the residual mask layer pattern and the first oxidation retarding layer. The second nitridation-treating the semiconductor substrate may comprise annealing the semiconductor substrate in a gas atmosphere containing nitrogen.

In accordance with an exemplary embodiment of the present invention, a method of fabricating a semiconductor device is provided. The method includes growing an oxidation retarding layer partially exposing a semiconductor substrate and growing a silicon oxide layer on the semiconductor substrate having the oxidation retarding layer to form gate insulating layers having different thicknesses on a region where the oxidation retarding layer is grown and on a region where the surface of the semiconductor substrate is exposed. Moreover, the oxidation retarding layer is formed to have at least one of a different thickness or nitrogen content on at least two different regions of the semiconductor substrate.

The oxidation retarding layer may be formed of a silicon oxynitride layer.

Forming the silicon oxynitride layer may comprise annealing the semiconductor substrate in a gas atmosphere containing nitrogen. The thickness and/or nitrogen content of the silicon oxynitride layer may be controlled by a flow rate of atmospheric gas, annealing time and/or annealing temperature.

BRIEF DESCRIPTION OF THE DRAWINGS

Embodiments of the present invention can be understood in more detail from the following description taken in conjunction with the accompanying drawings, in which:

FIGS. 6 to 11 are cross-sectional views illustrating a method of fabricating a semiconductor device according to an exemplary embodiment of the present invention.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the exemplary embodiments set forth herein.

FIGS. 1 to 5 are cross-sectional views illustrating a method of fabricating a semiconductor device having a multiple gate insulating layer according to an exemplary embodiment of the present invention.

Figure 1:
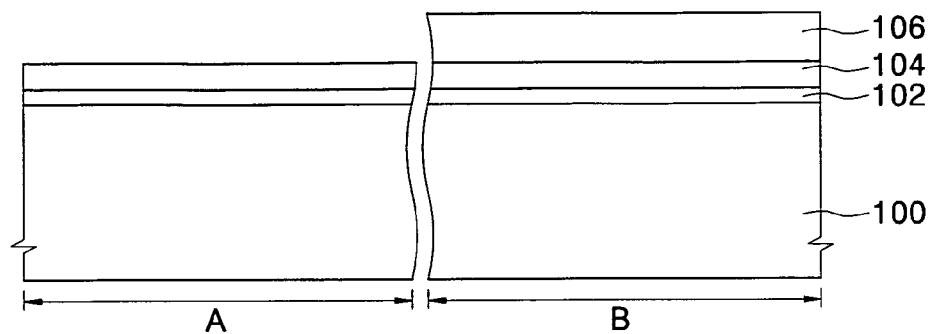
FIGS. 1 to 5 are cross-sectional views illustrating a method of fabricating a semiconductor device having a multiple gate insulating layer according to an exemplary embodiment of the present invention.

Referring to FIG. 1, a pad oxide layer 102 and a mask layer 104 are sequentially formed on a semiconductor substrate 100 having a first region A and a second region B. The semiconductor substrate 100 may be a single crystalline silicon substrate. The first region A may be a low voltage region, a PMOS region, a cell region or a DRAM region of an MDL device. Also, the second region B may be a high voltage region, an NMOS region, a peripheral region or a logic region of an MDL device. Before forming the pad oxide layer 102 and the mask layer 104 on the semiconductor substrate 100, an isolation layer, which defines an active region, may be formed by a typical isolation process such as, for example, a shallow trench isolation (STI) process. The regions shown in the figures indicate active regions which are defined on the first and second regions A and B by the isolation layer.

The pad oxide layer 102 may be formed, for example, of a silicon oxide layer grown from the surface of the semiconductor substrate 100 by a thermal oxidation process. The mask layer 104 may be formed, for example, of a silicon nitride layer, by a low pressure chemical vapor deposition (LPCVD) process. A photoresist layer is coated on the mask layer 104. The photoresist layer is patterned to form a photoresist pattern 106 exposing the first region A and covering the second region B by performing an exposure and development process.

Figure 2:
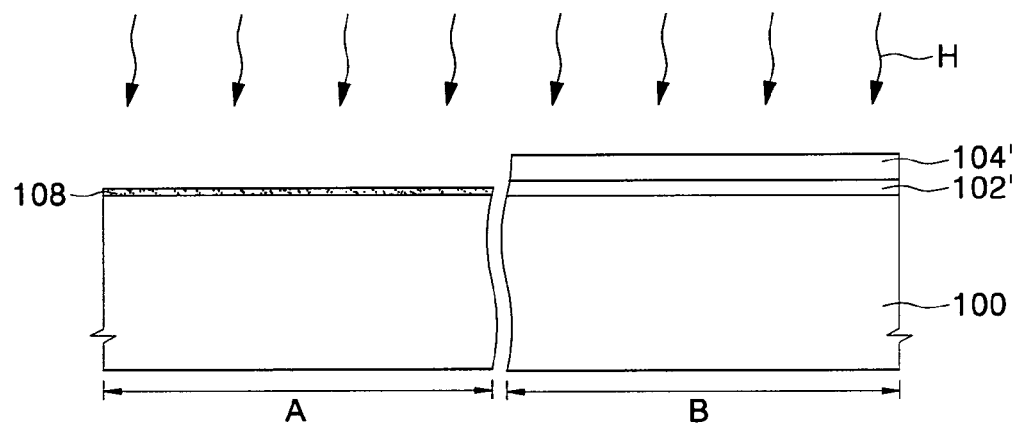

Referring to FIG. 2, the mask layer 104 and the pad oxide layer 102 are etched using the photoresist pattern 106 as an etch mask. As a result, a pad oxide layer pattern 102' and a mask layer pattern 104' are sequentially stacked on the second region B. The mask layer 104 and the pad oxide layer 102 may be sequentially etched by a dry etching process. After that, the photoresist pattern 106 is removed. Alternatively, the mask layer 104 may be dry-etched using the photoresist pattern 106 as an etch mask to form the mask pattern 104', the photoresist pattern 106 may then be removed, and then the exposed pad oxide layer 102 may be etched by a wet etching process using, for example, a solution containing fluoric acid as an etching solution.

After forming the pad oxide layer pattern 102' and the mask layer pattern 104', an oxidation retarding layer 108 is grown on the exposed semiconductor substrate 100 of the first region A. The oxidation retarding layer 108 may be formed, for example, of a silicon oxynitride layer. In this case, the silicon oxynitride layer may be formed by nitridation-treating the semiconductor substrate 100 having the pad oxide layer pattern 102' and the mask layer pattern 104'. The process of nitridation-treating the substrate 100 may include annealing the substrate 100 in a gas atmosphere containing nitrogen such as nitrogen oxide (NO), nitrous oxide ($N_2O$) or ammonia ($NH_3$). The annealing H may be performed at around atmospheric pressure, e.g., about 0.1 to about 10 torr, and a temperature of about 700 to about 1,000° C. Also, during the annealing H, the flow rate of atmospheric gas into the chamber may be about 100 to about 20,000 standard cubic centimeters per minute (sccm).

The mask layer pattern 104' prevents nitrogen and/or oxygen in the atmospheric gas from arriving at the surface of the semiconductor substrate 100 of the second region B during the annealing H. As a result, the silicon oxynitride layer may be selectively grown from the surface of the semiconductor substrate 100 of the first region A.

Figure 3:
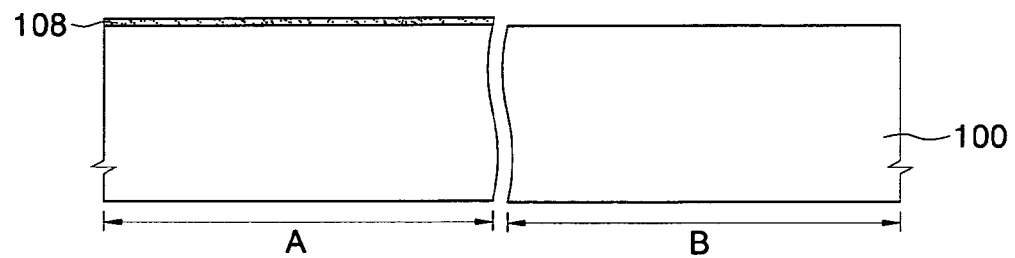

Referring to FIG. 3, the mask layer pattern 104' and the pad oxide layer pattern 102', which are shown in FIG. 2, are removed. The mask layer pattern 104' and the pad oxide layer pattern 102' may be removed, for example, by wet etching processes using etching solutions containing phosphoric acid and fluoric acid, respectively. After the mask layer pattern 104' and the pad oxide layer pattern 102' are removed, the oxidation retarding layer 108, which has an etch selectivity with respect to the mask layer pattern 104' and the pad oxide layer pattern 102', remains on the first region A, and the surface of the semiconductor substrate 100 of the second region B is exposed.

Figure 4:
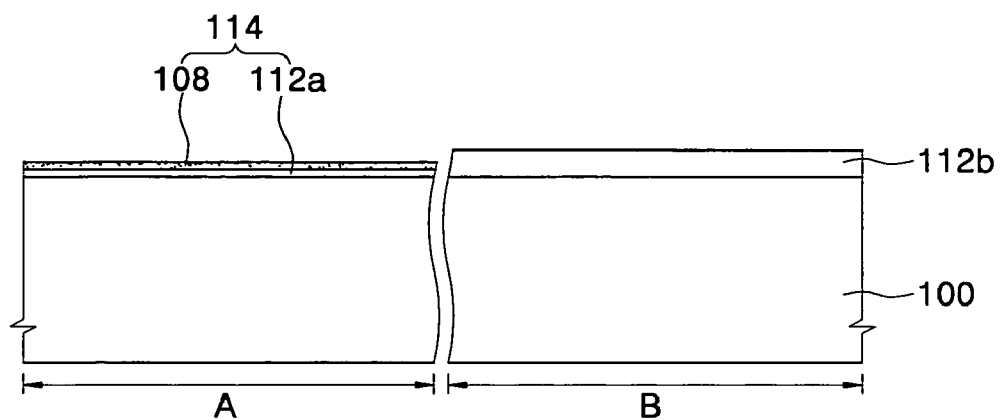

Referring to FIG. 4, a silicon oxide layer is grown on the semiconductor substrate 100 having the oxidation retarding layer 108. As a result, a first silicon oxide layer 112a is grown from the surface of the semiconductor substrate of the first region A, and at the same time, a second silicon oxide layer 112b is grown from the surface of the substrate 100 of the second region B. In the present exemplary embodiment, the silicon oxide layers 112a and 112b, and the silicon oxynitride layers provided as the oxidation retarding layer 108, are shown as if grown on the surface of the semiconductor substrate 100. However, part of the thicknesses of the silicon oxide layers 112a and 112b and the oxidation retarding layer 108, for example, about 30% of their thicknesses, may be grown downward into the semiconductor substrate 100.

The silicon oxide layers 112a and 112b may be grown, for example, by a dry or wet thermal oxidation process. Here, the thicknesses of the silicon oxide layers 112a and 112b grown from the surface of the semiconductor substrate 100 may be regulated by the oxidation retarding layer 108 selectively formed on the semiconductor substrate 100. That is, the silicon oxynitride layer formed as the oxidation retarding layer 108 retards or decreases the arrival of oxygen at the surface of the semiconductor substrate 100 of the first region A during the thermal oxidation process.

Consequently, as shown in FIG. 4, the first silicon oxide layer 112a, grown from the surface of the semiconductor substrate 100 of the first region A, is thinner than the second silicon oxide layer 112b grown from the surface of the semiconductor substrate 100 of the second region B. In this case, the thickness of the first silicon oxide layer 112a may be controlled by the thickness and/or nitrogen content of the silicon oxynitride layer provided as the oxidation retarding layer 108. Also, the thickness and/or nitrogen content of the silicon oxynitride layer may be controlled by the flow rate of atmospheric gas, annealing time and/or annealing temperature applied in the annealing process for forming the silicon oxynitride layer. Moreover, an upper region of the oxidation retarding layer 108 may be partially oxidized during the thermal oxidation process.

The first silicon oxide layer 112a and the oxidation retarding layer 108 are provided as a first gate insulating layer 114 on the first region A. When the oxidation retarding layer 108 is formed of the silicon oxynitride layer as described above, the first gate insulating layer 114 on the first region A may be formed of a stack of a silicon oxide layer and a silicon oxynitride layer. Also, the second silicon oxide layer 112b is provided as a second gate insulating layer on the second region B. Furthermore, the first gate insulating layer 114 formed on the first region A may have a smaller thickness than the second gate insulating layer formed on the second region B.

Figure 5:
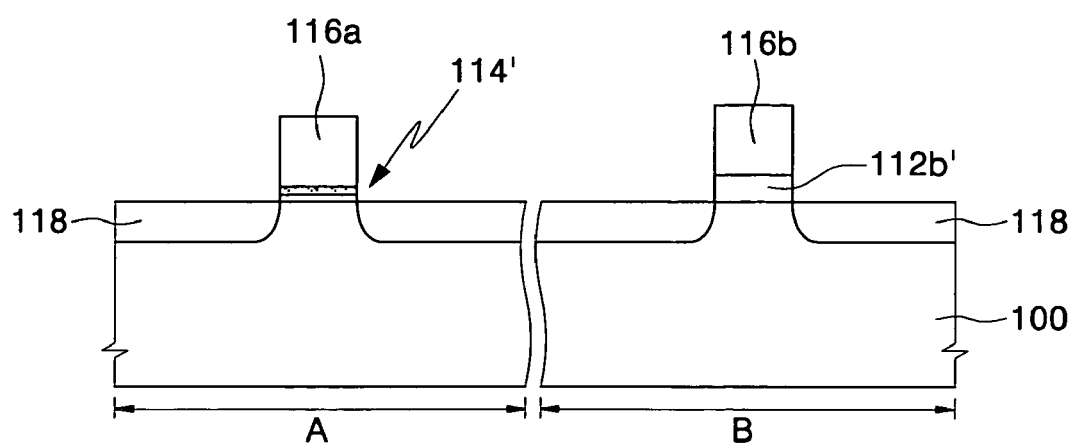

Referring to FIG. 5, a gate conductive layer is formed on the entire surface of the semiconductor substrate 100 having the gate insulating layers 114 and 112b. The gate conductive layer may be formed of, for example, a polysilicon layer. After that, the gate conductive layer may be patterned to form a first gate electrode 116a and a second gate electrode 116b on the first and second regions A and B using, for example, photolithography and etching processes. The gate insulating layers 114 and 112b may also be etched while etching the gate conductive layer. As a result, a first gate insulating pattern 114' may be formed under the first gate electrode 116a and a second gate insulating pattern 112b' may be formed under the second gate electrode 116b. Then, source and drain regions 118 are formed in the semiconductor substrate 100, at both sides of the gate electrodes 116a and 116b, by performing, for example, a typical ion-implantation process at least once.

The gate electrodes 116a and 116b may be doped with impurity ions. For example, when the first region A is a PMOS region and the second region B is an NMOS region, the first gate electrode 116a may be doped with p-type impurities such as boron, and the second gate electrode 116b may be doped with n-type impurities such as phosphorus. After doping the gate electrodes 116a and 116b with impurities, a heat treatment process is performed to activate the impurities. Here, when the gate insulating layer formed in the PMOS region is thin, p-type impurities such as, for example, boron of the PMOS gate electrode may penetrate into a channel region through the gate insulating layer, thereby causing polysilicon gate depletion and threshold voltage fluctuation. However, according to the exemplary embodiments of the present invention, as the silicon oxynitride layer provided as an oxidation retarding layer is formed on the first silicon oxide layer 112a, diffusion of p-type impurities into the channel region may be prevented. Also, a leakage current caused by the thin gate insulating layer may be prevented.

FIGS. 6 to 11 are cross-sectional views illustrating a method of fabricating a semiconductor device according to another exemplary embodiment of the present invention.

Referring to FIG. 6, a pad oxide layer 302 and a mask layer 304 are sequentially formed on a semiconductor substrate 300. The semiconductor substrate 300 has first, second and third regions C, D and E, respectively. The pad oxide layer 302 may be formed, for example, of a silicon oxide layer by using a thermal oxidation process. The mask layer 304 may be formed of, for example, a silicon nitride layer. Thereafter, a first photoresist pattern 306 is formed on the mask layer 304, which exposes the first region C and covers the second and third regions D and E.

Referring to FIG. 7, the pad oxide layer 302 and the mask layer 304 are etched using the first photoresist pattern 306 as an etch mask to form a mask layer pattern 304' and a pad oxide layer pattern 302' which expose the first region A. After the first photoresist pattern 306 is removed, a first oxidation retarding layer 308a is grown on the exposed semiconductor substrate 300 of the first region C. The first oxidation retarding layer 308a may be formed, for example, of a silicon oxynitride layer. The silicon oxynitride layer may be formed by performing a first annealing process H1 on the semiconductor substrate 300 having the mask layer pattern 304' and the pad oxide layer pattern 302' in a gas atmosphere containing, for example, nitrogen such as NO, $NO_2$ and $NH_3$. The first annealing process H1 may be performed at around atmospheric pressure, for example, at a pressure of about 0.1 to about 10 torr, and a temperature of about 700 to about 1,000° C. Also, the flow rate of atmospheric gas into a chamber may be about 100 to about 20,000 sccm.

Referring to FIG. 8, a second photoresist pattern 310 is formed on the semiconductor substrate 300 having the first oxidation retarding layer 308a. The second photoresist pattern 310 is formed to expose the second region D, and cover the first and third regions C and E. After that, the mask layer pattern 304' and the pad oxide layer pattern 302' are etched using the second photoresist pattern 310 as an etching mask. As a result, the mask layer pattern 304' and the pad oxide layer pattern 302' on the second region D are removed, thereby forming a residual mask layer pattern 304'' and a residual pad oxide layer pattern 302'' on the third region E.

Referring to FIG. 9, the second photoresist pattern 310 is removed. After the second photoresist pattern 310 is removed, the first oxidation retarding layer 308a remains on the first region C, and the third region E is protected by the residual mask layer pattern 304'' and the residual pad oxide layer pattern 302''. Also, the surface of the semiconductor substrate 300 of the second region B is exposed. Then, a second oxidation retarding layer 308b is grown on the second region D, and the first oxidation retarding layer 308a is further grown thereon at the same time. As described above, when the first oxidation retarding layer 308a is formed of a silicon oxynitride layer, the second oxidation retarding layer 308b may be formed of, for example, a silicon oxynitride layer.

The silicon oxynitride layer provided as the second oxidation retarding layer 308b may be formed, for example, by performing a second annealing process H2 on the semiconductor substrate 300 in a gas atmosphere containing nitrogen such as NO, $NO_2$ and $NH_3$. The second annealing process H2 may be performed at around atmospheric pressure, for example, about 0.1 to about 10 torr, and a temperature of about 700 to about 1,000° C. Also, the flow rate of gas into the chamber may be about 100 to about 20,000 sccm.

While growing the second oxidation retarding layer 308b, the first oxidation retarding layer 308a on the first region C is further grown. As a result, after the annealing process H2, a silicon oxynitride layer finally formed on the first region C and a silicon oxynitride layer formed on the second region D may have different properties from each other. That is, the silicon oxynitride layer grown on the first region C by both the first and second annealing processes H1 and H2 may be thicker and/or have a higher nitrogen content than the silicon oxynitride layer grown on the second region D by only the second annealing process H2.

After growing the second oxidation retarding layer 308b, the residual mask layer pattern 304'' and the residual pad oxide layer pattern 302'' are removed to expose the surface of the semiconductor substrate 300 on the third region E. The residual mask layer pattern 304'' and the residual pad oxide layer pattern 302'' may be removed by a wet etching process as described in FIG. 3.

Figure 10:
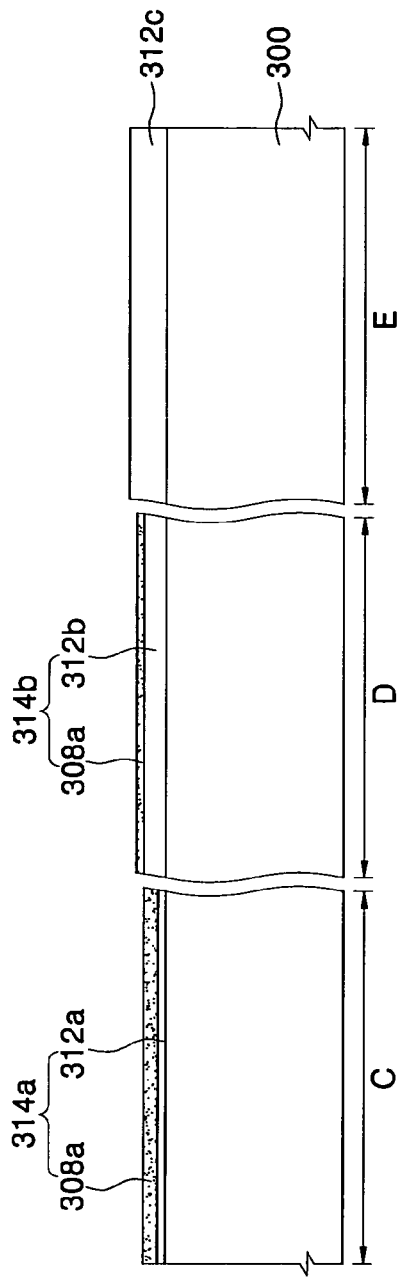

Referring to FIG. 10, a silicon oxide layer is grown on the semiconductor substrate 300 having the first and second oxidation retarding layers 308a and 308b. As a result, a first silicon oxide layer 312a is grown from the surface of the semiconductor substrate 300 of the first region C, a second silicon oxide layer 312b is grown from the surface of the semiconductor substrate 300 of the second region D, and at the same time, a third silicon oxide layer 312c is grown from the surface of the semiconductor substrate 300 of the third region E.

The silicon oxide layers 312a, 312b and 312c may be grown, for example, by a wet or dry thermal oxidation process. As described above, a first oxidation retarding layer 308a is formed on the first region C, and a second oxidation retarding layer 308b, which is thinner and/or has lower nitrogen content than the first oxidation retarding layer 308a, is formed on the second region D. Also, the surface of the semiconductor substrate 300 of the third region E is exposed. Consequently, as shown in FIG. 10, the second silicon oxide layer 312b is grown thicker than the first silicon oxide layer 312a, and the third silicon oxide layer 312c is grown to be thicker than the second silicon oxide layer 312b.

The first silicon oxide layer 312a and the first oxidation retarding layer 308a are provided as a first gate insulating layer 314a on the first region C, and the second silicon oxide layer 312b and the second oxidation retarding layer 308b are provided as a second gate insulating layer 314b on the second region D. As described above, when the oxidation retarding layers 308a and 308b are formed of a silicon oxynitride layer, the gate insulating layers 314a and 314b may be formed of a stack of a silicon oxide layer and a silicon oxynitride layer. Also, the third silicon oxide layer 312c is provided as a third gate insulating layer 314c on the third region E. Furthermore, the second gate insulating layer 314b formed on the second region D may be thinner than the third gate insulating layer 314c formed on the third region E, and the first gate insulating layer 314a formed on the first region C may be thinner than the second gate insulating layer 314b.

Figure 11:
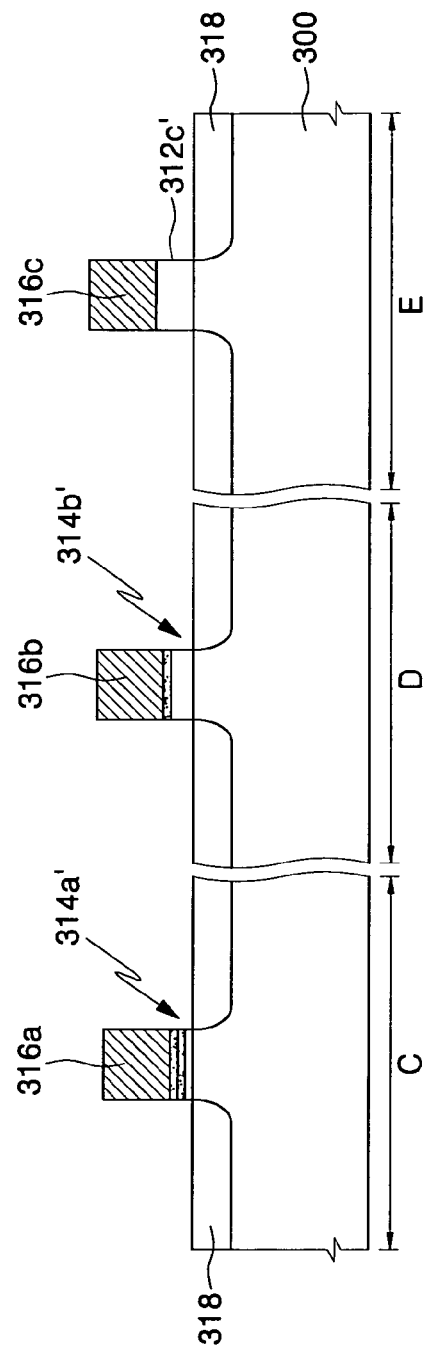

Referring to FIG. 11, first to third gate electrodes 316a, 316b and 316c are formed on the first, second and third regions C, D and E, respectively, by performing the same processes explained with reference to FIG. 5. In addition, while forming the gate electrodes 316a, 316b and 316c, gate insulating layer patterns 314a', 314b' and 312c' may be formed under the gate electrodes 316a, 316b and 316c. Then, source and drain regions 318 are formed on the semiconductor substrate 300 by performing, for example, a typical ion implantation process at least once.

According to the above-described exemplary embodiments of the present invention, after a silicon oxynitride layer used as an oxidation retarding layer is selectively grown on the semiconductor substrate, silicon oxide layers may then be grown to have different thicknesses on the semiconductor substrate through a single thermal oxidation process. Here, the thicknesses of the silicon oxide layers grown by the thermal oxidation process may be controlled by adjusting the thickness and/or nitrogen content of the oxidation retarding layer. While a method of forming gate insulating layers having different thicknesses in two or three different regions is described above, gate insulating layers having different thicknesses in four or more regions may also readily be formed through a single thermal oxidation process in accordance with exemplary embodiments of the present invention by repeatedly performing an annealing process in an atmosphere containing nitrogen and by patterning a mask pattern.

EXAMPLES

Figure 12:
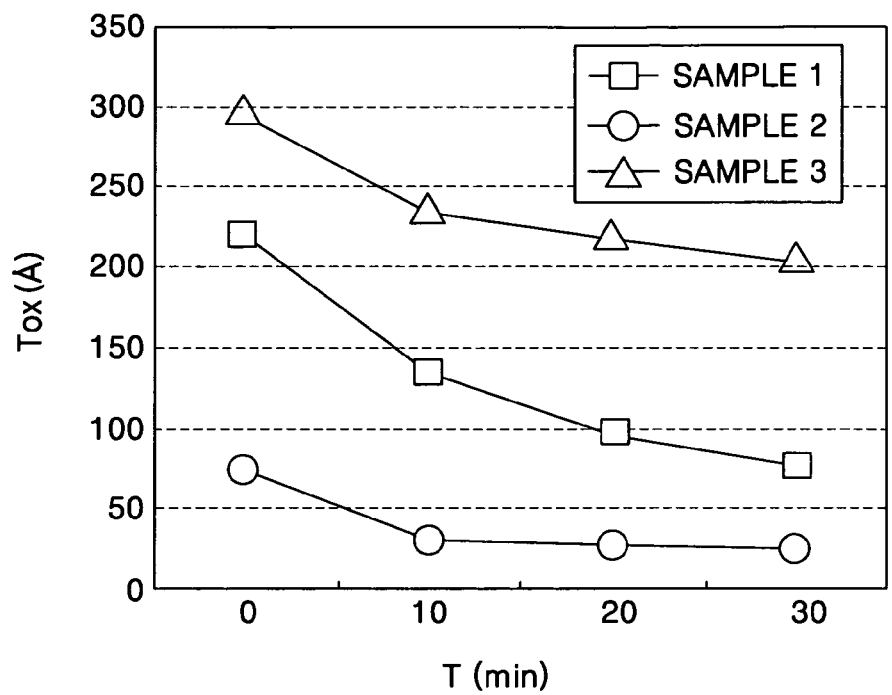
FIG. 12 is a graph of annealing time (T) for growing a silicon oxynitride layer versus thickness (Tox) of a silicon oxide layer grown by a thermal oxidation process.

FIG. 12 is a graph of annealing time (T) for growing a silicon oxynitride layer versus thickness (Tox) of a silicon oxide layer grown by a thermal oxidation process.

In FIG. 12, annealing processes for growing the silicon oxynitride layers were performed in an atmosphere of NO gas and at a temperature of about 850° C. for about 10, about 20 and about 30 minutes, respectively. After that, a thermal oxidation process was performed to grow a silicon oxide layer on the silicon substrates. Results from a first sample were obtained by performing a dry thermal oxidation process at a temperature of about 950° C. on the silicon substrates annealed during each annealing time for growing the silicon oxinitride layers. Results from a second sample were obtained by performing a dry thermal oxidation process at a temperature of about 900° C. on the silicon substrates annealed during each annealing time for growing the silicon oxinitride layers. Also, results from a third sample were obtained by performing a wet thermal oxidation process at a temperature of about 900° C. on the silicon substrates annealed during each annealing time for growing the silicon oxinitride layers.

Referring to FIG. 12, in all of the above-mentioned samples, each silicon oxide layer formed on a silicon substrate by a thermal oxidation process became thinner as the annealing time for growing a silicon oxynitride layer increased. The above-mentioned results, were obtained using methods in accordance with the exemplary embodiments of the invention. Moreover, these results show that when nitridation-treatments are applied to regions of a silicon substrate for different periods of time, silicon oxide layers may be simultaneously grown to have different thicknesses, and consequently, gate insulating layers may be formed to have different thicknesses.

Figure 13:
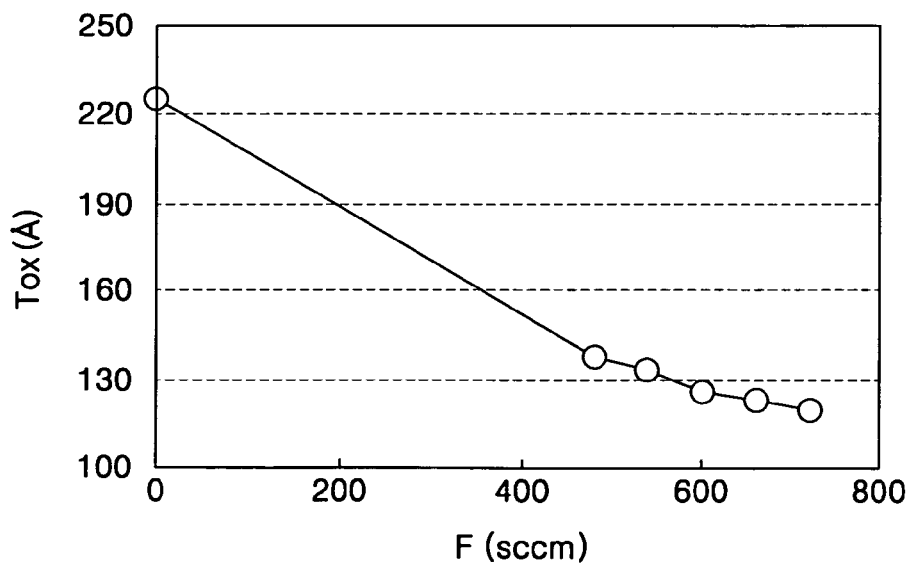
FIG. 13 is a graph of flow rate (F) of NO gas supplied for growing a silicon oxinitride layer versus thickness (Tox) of a silicon oxide layer grown by a thermal oxidation process.

FIG. 13 is a graph of flow rate (F) of NO gas supplied for growing a silicon oxinitride layer versus thickness (Tox) of a silicon oxide layer grown by a thermal oxidation process.

In FIG. 13, annealing processes for growing silicon oxynitride layers were performed for about 10 minutes at a temperature of about 850° C., and a dry thermal oxidation process was performed at about 900° C. to grow a silicon oxide layer.

Referring to FIG. 13, as the flow rate of NO gas supplied during the annealing processes increased and thus the nitrogen content of the silicon oxynitride layers increased, the thickness of the silicon oxide layer grown by the following thermal oxidation process thereby decreased. This shows that the thickness of the entire gate insulating layer including the silicon oxide layer as well as the thickness of the silicon oxide layer, may be controlled by adjusting the flow rate of atmospheric gas applied during the annealing process for growing the oxinitride layers.

According to the above exemplary embodiments of the invention, gate insulating layers may be formed to have different thicknesses on a semiconductor substrate through a single oxidation process. Also, gate insulating layers having relatively thin thicknesses may be formed of a stack of a silicon oxide layer and a silicon oxynitride layer, thereby preventing polysilicon gate depletion and threshold voltage fluctuation caused by impurities penetrating from a gate electrode to a channel region.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a semiconductor device, comprising:

preparing a semiconductor substrate having a first active region, a second active region and a third active region;

forming a mask layer formed of an inorganic material on the first, second and third active regions;

forming a photoresist pattern on the mask layer on the second and third active regions;

forming a mask layer pattern on the second and third active regions by removing the mask layer from the first active region using the photoresist pattern as an etching mask;

removing the photoresist pattern;

growing a first oxidation retarding layer on the first active region with the mask layer pattern present on the second and third active regions by performing a first nitridation-treating of the first, second and third active regions of the semiconductor substrate;

forming a residual mask layer pattern remaining on the third active region by removing the mask layer pattern from the second active region;

growing a second oxidation retarding layer on the second active region, and further growing the first oxidation retarding layer, wherein the growing of the second oxidation retarding layer on the second active region and the further growing of the first oxidation retarding layer are performed simultaneously with the residual mask layer pattern present on the third active region by performing a second nitridation-treating of the first, second and third active regions of the semiconductor substrate;

removing the residual mask layer pattern from the third active region; and growing a silicon oxide layer on the semiconductor substrate having the first and second oxidation retarding layers to form gate insulating layers having different thicknesses from one another on the first, second and third active regions.

2. The method according to claim 1, wherein the silicon oxide layer is grown to have a first thickness on the first active region, to have a second thickness on the second active region that is thicker than the first thickness, and to have a third thickness on the third active region that is thicker than the second thickness.

3. The method according to claim 1, wherein the first and second oxidation retarding layers are formed of silicon oxynitride layers.

4. The method according to claim 3, wherein the gate insulating layers are formed of a stack of a silicon oxide layer and a silicon oxynitride layer on the first and second active regions and of a silicon oxide layer on the third active region, and wherein the gate insulating layers are formed thicker on the second active region than on the first active region and thicker on the third active region than on the second active region.

5. The method according to claim 1, wherein the first nitridation-treating of the semiconductor substrate comprises annealing the semiconductor substrate in a gas atmosphere comprising nitrogen.

6. The method according to claim 1, wherein the nitridation-treating of the semiconductor substrate comprises annealing the semiconductor substrate in a gas atmosphere comprising nitrogen.

7. The method according to claim 1, further comprising forming gate electrodes on the first, second and third active regions, after forming the gate insulating layers.

8. A method of fabricating a semiconductor device, comprising:

growing an oxidation retarding layer partially exposing a semiconductor substrate; and growing a silicon oxide layer on the semiconductor substrate having the oxidation retarding layer to form gate insulating layers having different thicknesses from one another on a region where the oxidation retarding layer is grown and on a region where a surface of the semiconductor substrate is exposed, wherein the oxidation retarding layer is formed simultaneously on at least two different active regions of the semiconductor substrate by performing a nitridation-treating of the at least two different active regions of the semiconductor substrate such that the oxidation retarding layer formed has at least one of a different thickness or nitrogen content on the at least two different active regions of the semiconductor substrate.

9. The method according to claim 8, wherein the oxidation retarding layer is formed of a silicon oxynitride layer.

10. The method according to claim 9, wherein the growing of the silicon oxynitride layer comprises annealing the semiconductor substrate in a gas atmosphere comprising nitrogen.

11. The method of claim 1, wherein the mask layer pattern is formed of a silicon nitride layer.

* * * * *